United States Patent
Nagai

(10) Patent No.: US 8,334,533 B2
(45) Date of Patent: Dec. 18, 2012

(54) SEMICONDUCTOR DEVICE INCLUDING A CIRCUIT AREA AND A MONITOR AREA HAVING A PLURALITY OF MONITOR LAYERS AND METHOD FOR MANUFACTURING THE SAME

(75) Inventor: Kouichi Nagai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/855,482

(22) Filed: Sep. 14, 2007

(65) Prior Publication Data

US 2008/0001147 A1    Jan. 3, 2008

Related U.S. Application Data

(63) Continuation of application No. PCT/JP2005/004692, filed on Mar. 16, 2005.

(51) Int. Cl.
*H01L 29/10* (2006.01)
(52) U.S. Cl. .................. 257/48; 257/E23.173
(58) Field of Classification Search ............. 257/48, 257/E23.173
See application file for complete search history.

(56) References Cited

U.S. PATENT DOCUMENTS

| | | | |
|---|---|---|---|
| 5,831,330 A * | 11/1998 | Chang | 257/620 |
| 6,480,017 B2 | 11/2002 | Narita | |
| 6,774,660 B2 | 8/2004 | Narita | |
| 6,922,070 B2 | 7/2005 | Narita | |
| 6,962,827 B1 * | 11/2005 | Furue et al. | 438/14 |
| 7,256,079 B2 * | 8/2007 | Asano et al. | 438/163 |
| 2002/0036505 A1 | 3/2002 | Narita | |
| 2003/0006795 A1 * | 1/2003 | Asayama et al. | 324/763 |
| 2003/0020510 A1 | 1/2003 | Narita | |
| 2004/0201093 A1 | 10/2004 | Narita | |
| 2005/0196883 A1 * | 9/2005 | Asano et al. | 438/17 |

FOREIGN PATENT DOCUMENTS

| | | | |
|---|---|---|---|
| JP | 60083344 A | 5/1985 |
| JP | 60109240 A | 6/1985 |
| JP | 1225138 A | 9/1989 |

(Continued)

OTHER PUBLICATIONS

Translation of International Preliminary Report on Patentability mailed Sep. 27, 2007 of International Application No. PCT/JP2005/004692.

(Continued)

*Primary Examiner* — Eugene Lee
*Assistant Examiner* — Elias M Ullah
(74) *Attorney, Agent, or Firm* — Westerman, Hattori, Daniels & Adrian, LLP

(57) ABSTRACT

In a circuit area wherein a semiconductor integrated circuit is to be formed, an isolation insulating film is formed on a surface of a semiconductor substrate (11), and, at the same time, five isolation insulating films (12m) extending in one specific direction are formed within a monitor area (1) at a fixed spacing. Then, a gate insulation film and a gate electrode are formed within the circuit area on the semiconductor substrate (11), and, at the same time, five gate insulation films (13m) and five gate electrodes (14m) extending in the same direction as the isolation insulating films (12m) are formed within the monitor area (1) at the same spacing as that of the isolation insulating films (12m).

11 Claims, 15 Drawing Sheets

FOREIGN PATENT DOCUMENTS

| | | | |
|---|---|---|---|
| JP | 7235577 | A | 9/1995 |
| JP | 2000216210 | A | 8/2000 |
| JP | 2000332077 | A | 11/2000 |
| JP | 2002-100662 | A | 4/2002 |
| JP | 2003258051 | A | 9/2003 |
| KR | 2001-0036751 | * | 5/2001 |
| KR | 2001-0036751 | A | 5/2001 |
| KR | 2003-0093327 | A | 12/2003 |
| WO | WO 02/086961 | A1 | 10/2002 |

OTHER PUBLICATIONS

International Search Report of PCT/JP2005/004692, date of mailing Apr. 26, 2005.
Korean Office Action dated Jul. 21, 2008 (mailing date), issued in corresponding Korean Patent Application No. 10-2007-7019624.
Japanese Office Action dated Aug. 17, 2010, issued in correspond Japanese Patent Application No. 2007-507993.

* cited by examiner

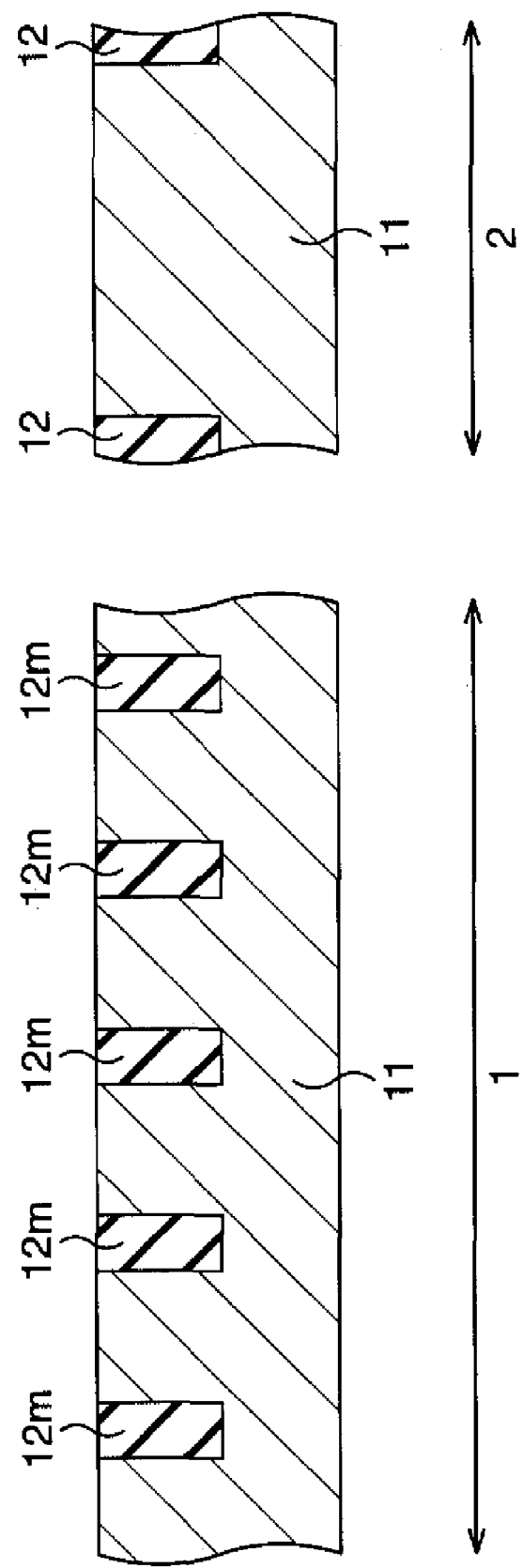

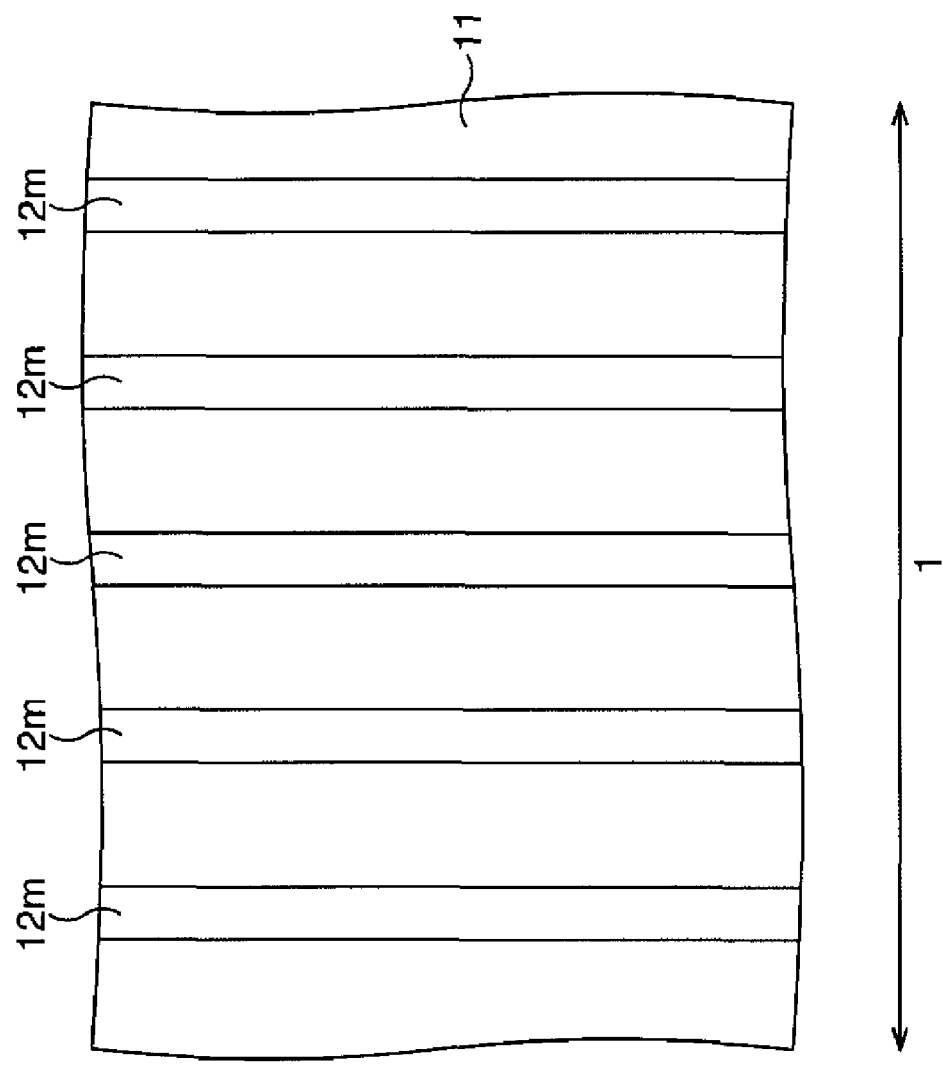

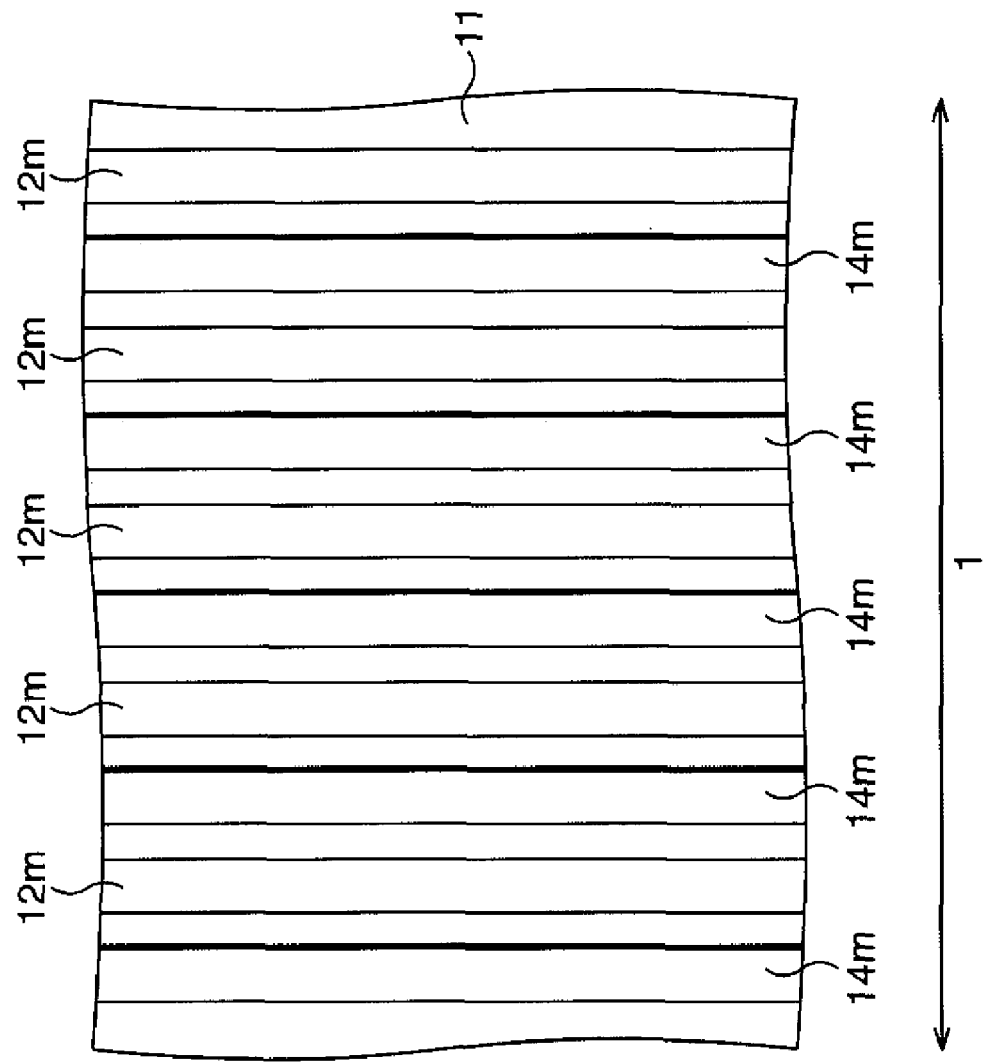

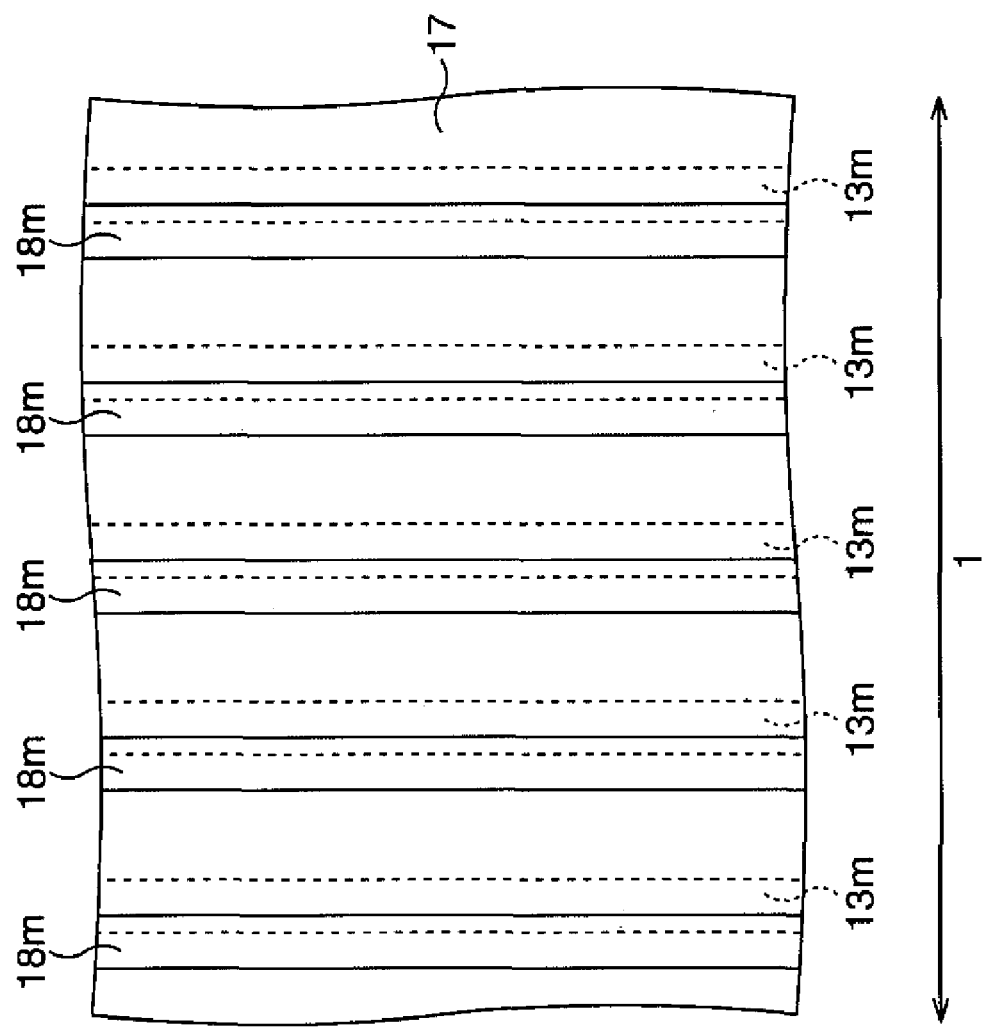

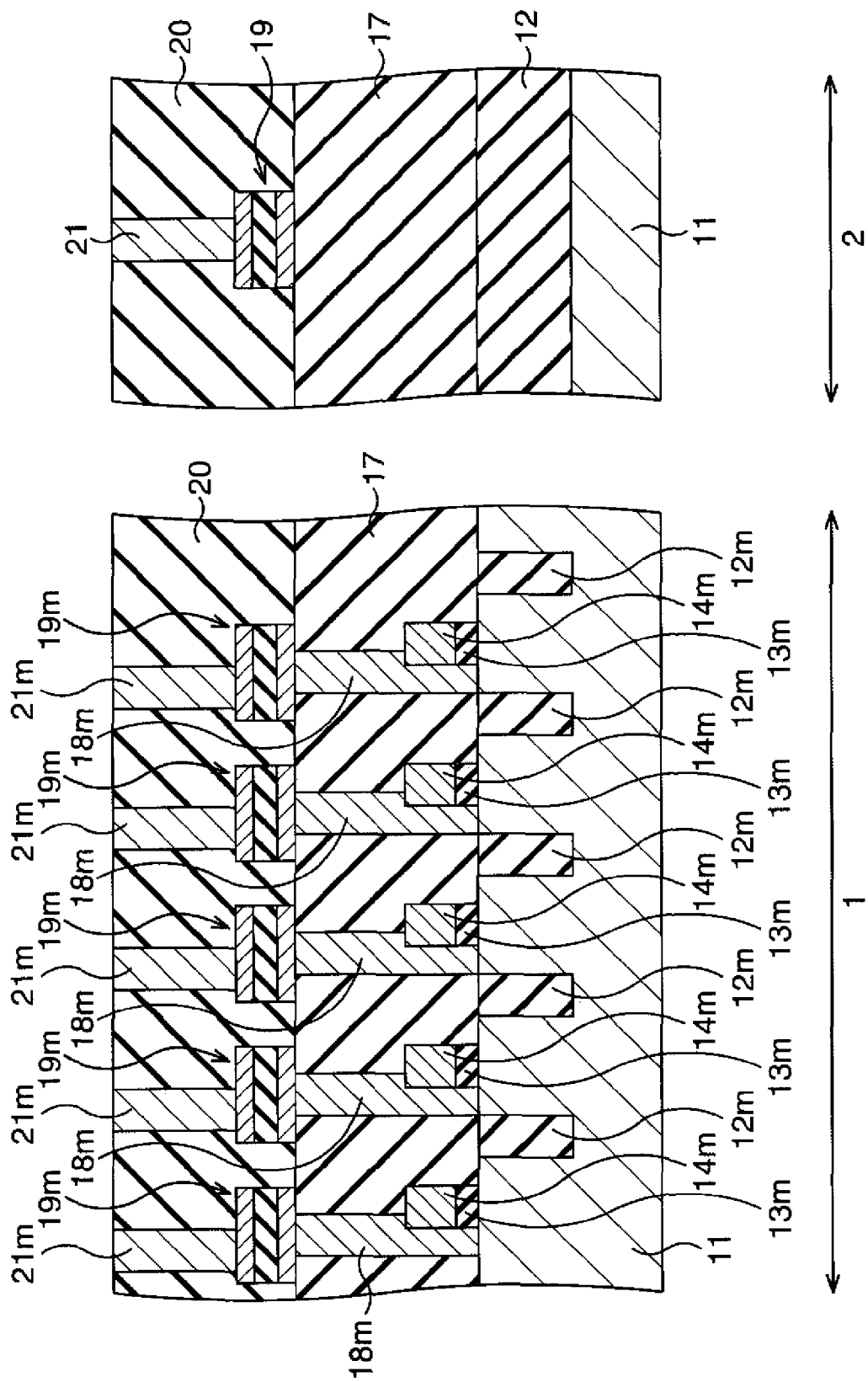

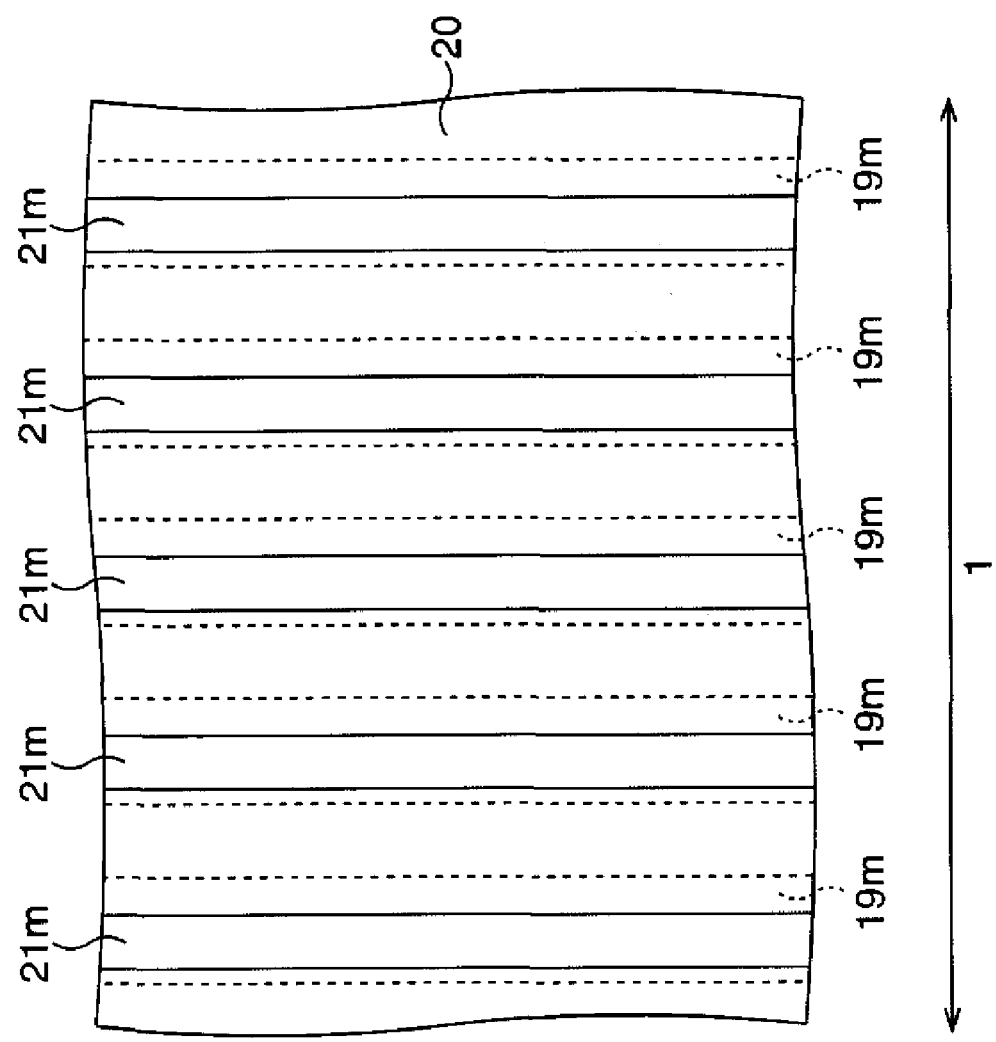

SEMICONDUCTOR DEVICE INCLUDING A CIRCUIT AREA AND A MONITOR AREA HAVING A PLURALITY OF MONITOR LAYERS AND METHOD FOR MANUFACTURING THE SAME

TECHNICAL FIELD

The present invention relates to a semiconductor device wherein if a failure occurs, the cause thereof can be easily identified, and to a method for manufacturing the semiconductor device.

BACKGROUND ART

Subsequent to manufacturing of semiconductor devices, various characteristics of elements are tested for purposes of detecting process defects and characteristic variations and of implementing process control. When conducting theses tests, test-purpose circuits and patterns referred to as Test Element Group (TEG) are used. The TEG reflects the characteristics of elements within a semiconductor integrated circuit that operates actually, including transistors, resistors, capacitors and wirings. It is therefore possible to estimate the characteristics of elements within the semiconductor integrated circuit by measuring the characteristics of the TEG.

The TEG is usually formed within a chip-forming region or a scribe line of a semiconductor wafer concurrently with elements in a semiconductor integrated circuit. In other words, the TEG is formed by, for example, a photolithography technique using a reticle (mask for exposure) whereon patterns for elements and TEGs are formed. FIGS. 10A and 10B illustrate conventional layouts of TEGs.

FIG. 10A illustrates an example of transferring a single chip in one shot. In this example, pads 102 are formed in the periphery of each chip 101 and TEGs 103 are formed in the four corners. FIG. 10B illustrates an example of transferring a plurality of chips in one shot. In this example, TEGs 113 are formed within a scribe line between chips 111.

Conventionally, monitoring tests are conducted using such TEGs as described above to determine whether or not a manufactured semiconductor device operates normally. Then, the manufacturing process is reviewed according to the results of determination if any failure is found. In Patent Documents 1 to 4, various examples of TEGs and the like are cited.

However, even if the results of monitoring tests or probe tests (PT) using conventional TEGs are favorable, some semiconductor devices may suffer an operational failure as time advances. In order to investigate the cause of the failure in such a case, the cross section of the semiconductor device must be examined. In some cases, however, it is not possible to investigate the cause even if such an examination is carried out. This results in a failure to identify the cause and establish countermeasures. The problem thus remains unsolvable for a long period of time.

Patent document 1: Japanese Patent Application Laid-Open No. Sho 60-83344
Patent document 2: Japanese Patent Application Laid-Open No. Sho 60-109240
Patent document 3 Japanese Patent Application Laid-Open No. Hei 01-225138
Patent document 4: Japanese Patent Application Laid-Open No. 2000-332077

SUMMARY OF THE INVENTION

An object of the present invention is to provide a semiconductor device wherein if a failure occurs, the cause thereof can be easily investigated without impairing high integration, and to provide a method for manufacturing the semiconductor device.

As a result of mature consideration in order to solve the above-described problems, the inventor of the patent application has found the following problems with conventional semiconductor devices whereon TEGs are formed. That is, even if observing the cross section of such a semiconductor device after the occurrence of a failure, it is not possible to obtain adequate information since a portion revealed on the cross section is part of the TEG. Another problem is that it is not possible to estimate the amount of positional shift arising between layers. Yet another problem is that in portions where originally planar-shaped parts are curved, such as contact holes, the dimensions of a revealed part vary depending on the cross section observed. As a result, it is not possible to precisely estimate the width, radius and the like.

In cases where a plurality of chips are transferred in one shot, information on chips positioned near a TEG may be easily reflected in the TEG. However, there may be a failure or failures in chips positioned farther from the TEG even if no failures are found in the TEG. For example, if there is a distortion during transfer, precise transfer may not be achieved in a peripheral part of a wafer, whereas such transfer is achieved in the central part of the wafer. This problem can be solved if TEGs are provided adjacent to all chips. However, this will result in an increase in the chip area. This will also lead to the problem that the time required for tests increases tremendously.

In view of the forgoing problems, the inventor of the present application has conceived of the following embodiments of the present invention.

In a semiconductor device according to the present invention, there are provided a circuit area in which a semiconductor integrated circuit is formed and a monitor area having at least two monitor layers simultaneously formed together with at least two layers each composing the semiconductor integrated circuit. In addition, each of the monitor layers has at least two monitor patterns of the same shape disposed apart from each other.

In a method for manufacturing a semiconductor device according to the present invention, with a semiconductor substrate being partitioned into a circuit area and a monitor area, a first layer composing a semiconductor integrated circuit is formed within the circuit area and a first monitor layer is formed in the monitor area; thereafter, a second layer composing the semiconductor integrated circuit is formed on or above the first layer and a second monitor layer is formed on or above the first monitor layer. At least two monitor patterns of the same shape disposed apart from each other are formed in each of the first and second monitor layers.

BRIEF DESCRIPTION OF THE DRAWINGS

FIG. 2A is a cross-sectional view illustrating a method for manufacturing the semiconductor device according to the embodiment of the present invention;

FIG. 2B is a plan view illustrating the method for manufacturing the semiconductor device according to the embodiment of the present invention;

FIG. 3B is a plan view illustrating the method for manufacturing the semiconductor device following FIG. 2B;

FIG. 4B is a plan view illustrating the method for manufacturing the semiconductor device following FIG. 3B;

FIG. 5A is a cross-sectional view illustrating the method for manufacturing the semiconductor device following FIG. 4A;

FIG. 5B is a plan view illustrating the method for manufacturing the semiconductor device following FIG. 4B;

DETAILED DESCRIPTION OF THE PREFERRED EMBODIMENTS

Figure 1:
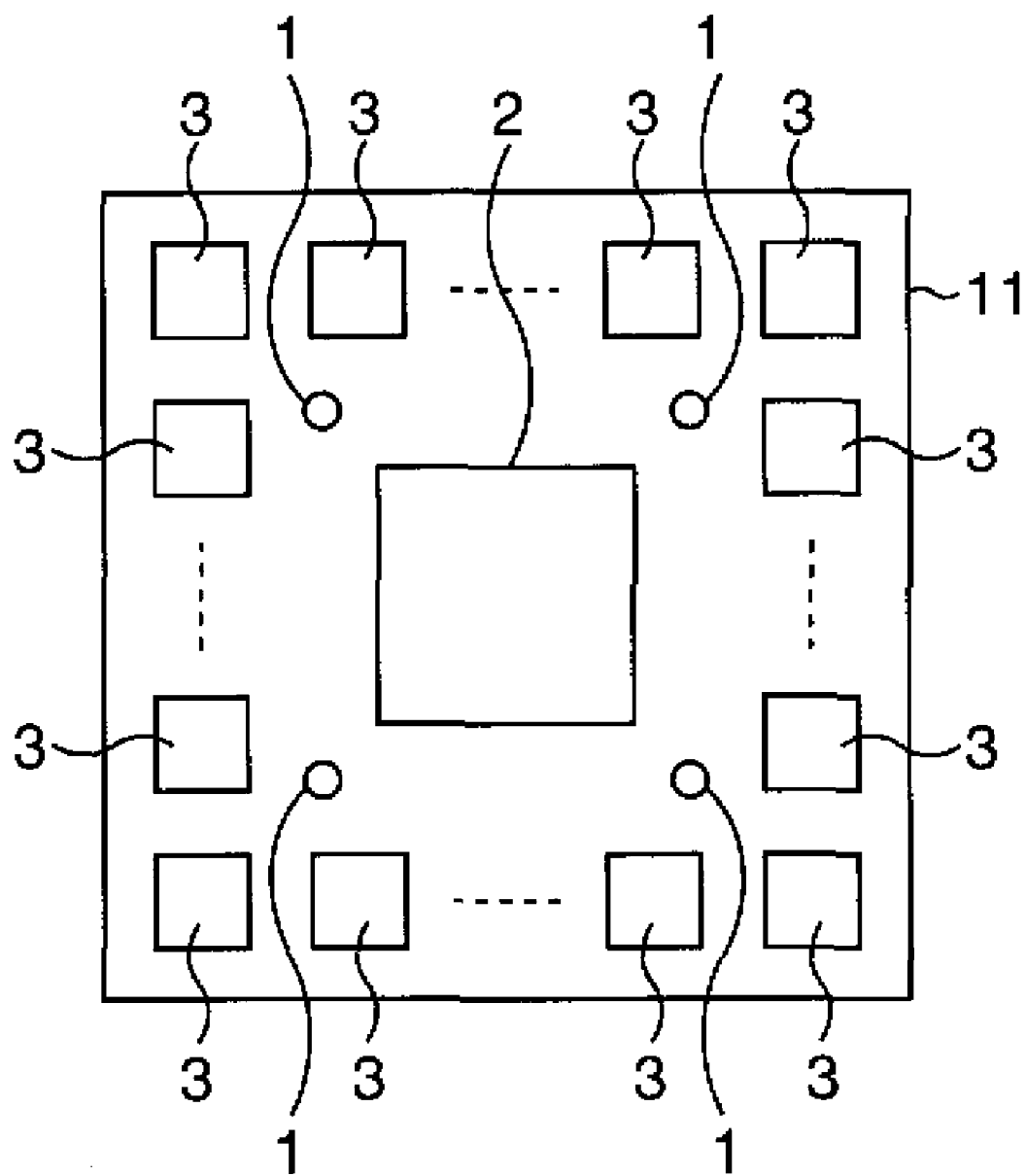
FIG. 1 is a schematic view illustrating a layout of a semiconductor device according to an embodiment of the present invention.

Preferred embodiments of the present invention will be specifically described hereinafter with reference to the accompanying drawings. FIG. 1 is a schematic view illustrating a layout of a semiconductor device according to an embodiment of the present invention.

In this embodiment, there is provided a circuit area 2 wherein a semiconductor integrated circuit that operates actually is formed, as well as a plurality of pads 3 around the circuit area 2. The pads 3 are connected to elements composing the semiconductor integrated circuit. In addition, monitor areas 1 are provided in four places between the circuit area 2 and the pads 3. Each monitor area 1 is provided, for example, between each vertex of a semiconductor substrate 11 diced into a rectangular form and each vertex of the circuit area 2 the planar shape of which is rectangular.

Next, an explanation will be made of a method for manufacturing the semiconductor device according to the embodiment of the present invention. The cross-sectional structure of the monitor area 1 will also be explained here. FIGS. 2A to 5A and FIG. 6 are cross-sectional views illustrating a method for manufacturing the semiconductor device according to the embodiment of the present invention in the order of steps. Likewise, FIGS. 2B to 5B are plan views illustrating the method for manufacturing the semiconductor device according to the embodiment of the present invention in the order of steps.

First, as shown in FIGS. 2A and 2B, an isolation insulating film 12 is formed within the circuit area 2 on a surface of the semiconductor substrate 11, and, at the same time, five isolation insulating films 12m extending in a specific direction are formed at a fixed spacing within the monitor area 1 on the surface of the semiconductor 11. It should be noted that it is preferable that the spacing of the isolation insulating films 12m be greater than the minimum design rule applied when manufacturing the semiconductor device. For example, when the semiconductor device is manufactured with using a 0.18 μm design rule, it is preferable that the spacing of the isolation insulating films 12m be 0.25 μm.

Figure 3A:
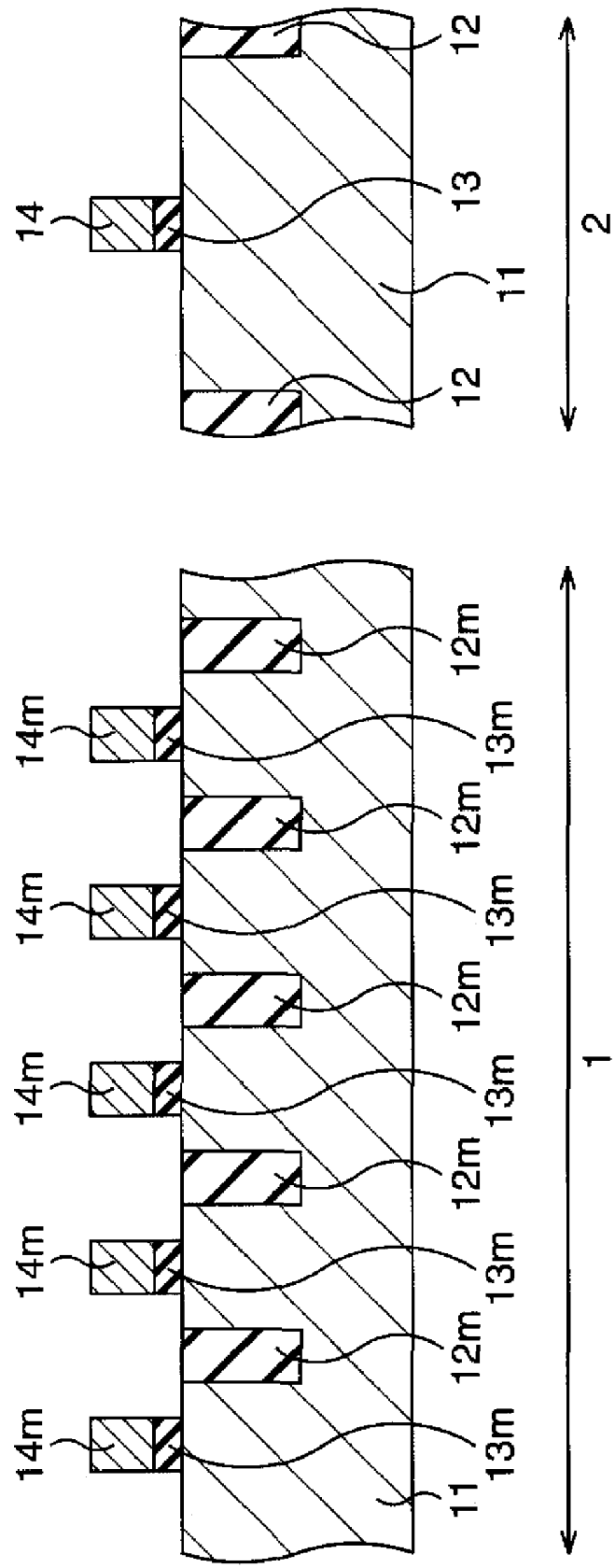
FIG. 3A is a cross-sectional view illustrating the method for manufacturing the semiconductor device following FIG. 2A.

Next, as shown in FIGS. 3A and 3B, a gate insulation film 13 and a gate electrode 14 are formed within the circuit area 2 on the semiconductor substrate 11, and, at the same time, five gate insulation films 13m and five gate electrodes 14m extending in the same direction as the isolation insulating films 12m are formed within the monitor area 1 on the semiconductor substrate 11 at the same spacing as that of the isolation insulating films 12m. Although the gate insulation films 13m need not necessarily be formed, they need not be removed purposely since they are inevitably formed when the gate electrodes 14m are formed concurrently with the gate electrode 14. The gate electrodes 14m and gate insulation films 13m may be formed so as to overlap the isolation insulating films 12m. This is because, as explained later, any electrical signals need not be transmitted through patterns formed within the monitor area 2.

Figure 4A:
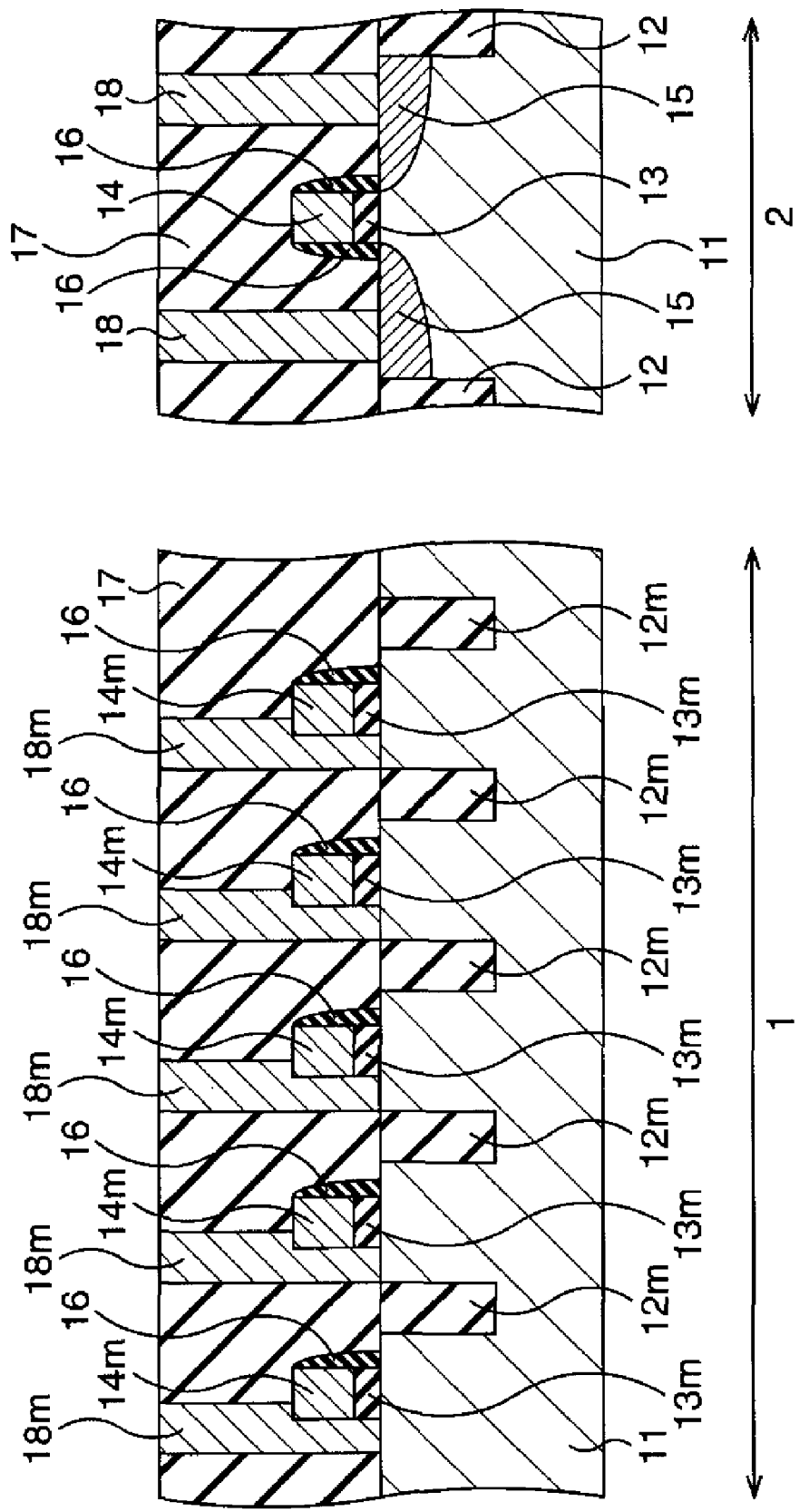
FIG. 4A is a cross-sectional view illustrating the method for manufacturing the semiconductor device following FIG. 3A.

In the next step, as shown in FIG. 4A, impurity-diffused layers 15 are formed within the circuit area 2 on the surface of the semiconductor substrate 11. In addition, side walls 16 are formed on sides of the gate electrode 14 and the gate electrode 14m within the monitor area 1 and the circuit area 2. It should be noted that the side wall 16 needs not be formed on the side of each gate electrode 14m. It should be also noted that the impurity-diffused layers 15 may be formed prior to and subsequent to forming the side walls 16.

Thereafter, as shown in FIGS. 4A and 4B, an interlayer insulating film 17 is formed all over the surface. Next, contact holes are formed in the interlayer insulating film 17 within the circuit area 2, and, at the same time, five contact grooves extending in the same direction as the isolation insulating films 12m are formed in the interlayer insulating film 17 within the monitor area 1 at the same spacing as that of the isolation insulating films 12m. Then, contact plugs 18 are formed within the circuit area 2 and contact plugs 18m are formed within the monitor area 1 by embedding conductive films in the contact holes and contact grooves. It should be noted that the contact grooves and the contact plugs 18m may be formed so as not to overlap the gate electrodes 14m.

Next, as shown in FIG. 5A, a ferroelectric capacitor 19 including a bottom electrode, a ferroelectric film and a top electrode is formed on the interlayer insulating film 17 within the circuit area 2, and, at the same time, five ferroelectric capacitors 19m extending in the same direction as the isolation insulating films 12m are formed within the monitor area 1 at the same spacing as that of the element-isolation insulating films 12m. It should be noted that the ferroelectric capacitors 19m may be formed so as not to overlap the contact plugs 18m. The cross-sectional view of the circuit area 2 shown in FIG. 5A indicates an area different from the cross-sectional views shown in FIGS. 2A to 4A.

Then, as shown in FIGS. 5A and 5B, an interlayer insulating film 20 is formed all over the surface. Thereafter, via holes are formed in the interlayer insulating film 20 within the circuit area 2, and, at the same time, five via grooves extending in the same direction as the isolation insulating films 12m are formed in the interlayer insulating film 20 within the monitor area 1 at the same spacing as that of the isolation insulating films 12m. Then, a via plug 21 is formed within the circuit area 2 and via plugs 21m are formed within the monitor area 1 by embedding conductive films in the via hole and via grooves. It should be noted that the via grooves and the via plugs 21m may be formed so as not to overlap the ferroelectric capacitors 19m.

Figure 6:
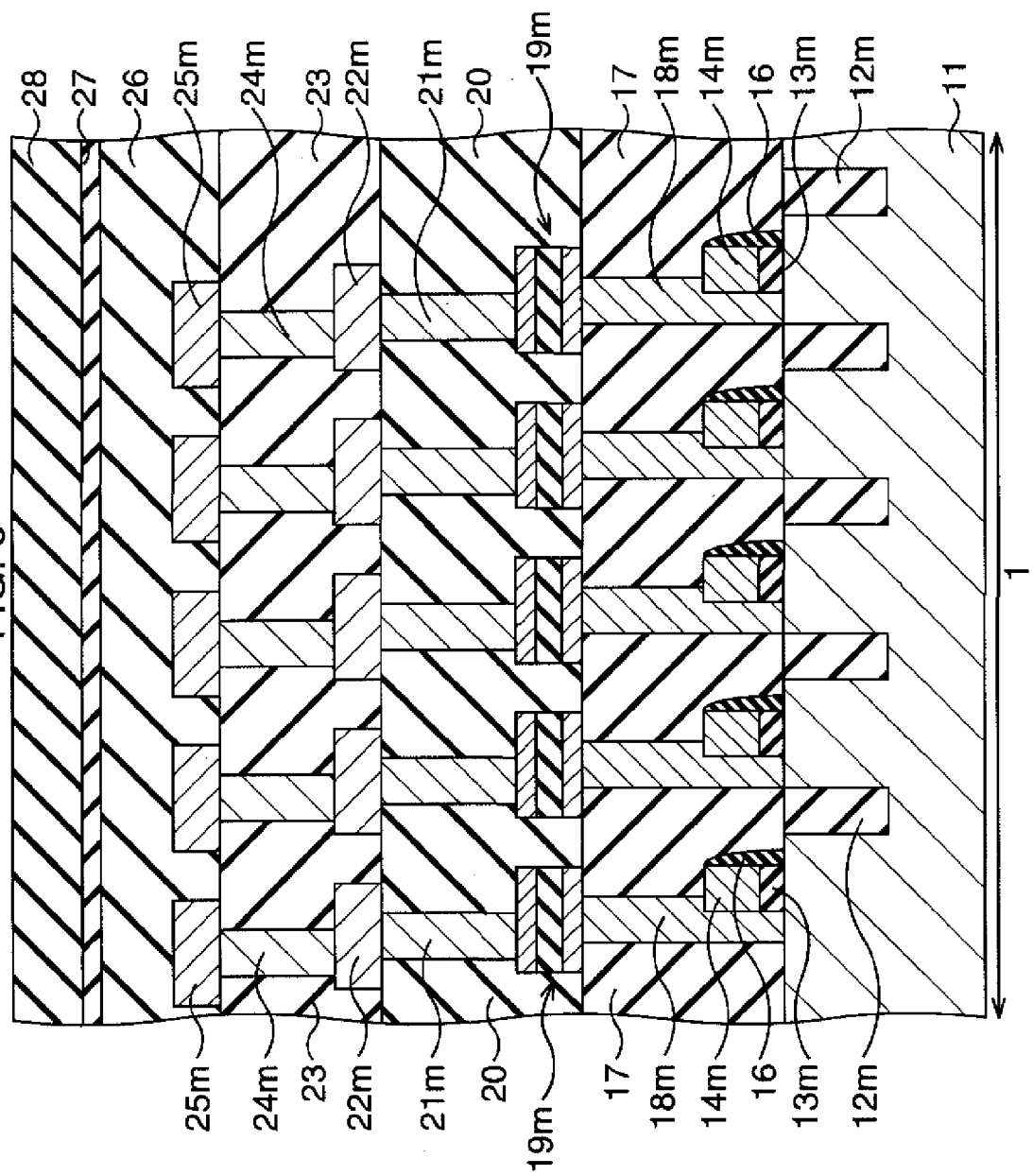
FIG. 6 is a cross-sectional view illustrating the method for manufacturing the semiconductor device following FIG. 5A.

Thereafter, wirings (not shown) are formed on the interlayer insulating film 20 within the circuit area 2, and, at the same time, as shown in FIG. 6, five wirings 22m extending in the same direction as the isolation insulating films 12m are formed within the monitor area 1 at the same spacing as that of the isolation insulating films 12m. Then, an interlayer insulating film 23 is formed all over the surface. Next, via holes are formed in the interlayer insulating film 23 within the circuit area 2, and, at the same time, five via grooves extending in the same direction as the isolation insulating films 12m are formed within the monitor area 1 at the same spacing as that of the isolation insulating films 12m. Then, via plugs (not shown) are formed within the circuit area 2 and via plugs 24m are formed, as shown in FIG. 6, within the monitor area 1 by embedding conductive films in these via holes and via grooves.

In a further step, wirings (not shown) are formed on the interlayer insulating film 23 within the circuit area 2, and, at the same time, as shown in FIG. 6, five wirings 25m extending in the same direction as the isolation insulating films 12m are formed within the monitor area 1 at the same spacing as that of the isolation insulating films 12m. Then, a silicon oxide film 26, a silicon nitride film 27 and a polyimide film 28 are successively formed all over the surface.

It should be noted that the wirings 22m, via plugs 24m and wirings 25m may be formed so as not to overlap the conductive films lying thereunder.

As described above, in this embodiment, at the same time of formation of films within the circuit area 2, five linear patterns composed of films similar to the above-mentioned films are formed within the monitor area 1. The five linear patterns extend in the same direction each other and the spacing of the five linear patterns is uniform. Consequently, when a failure occurs after manufacturing, it is possible to easily know whether precise exposure was achieved when films were formed within the circuit area 2, by observing a cross section perpendicular to the direction in which these linear patterns extend. It is also possible to know whether any unintentional positional shifts occurred between films or layers overlapping each other.

In addition, there is no need to transmit electrical signals through the monitor area 1 as with TEGs since the monitor areas 1 are formed for the purpose of observing cross sections. It is therefore not necessary to form such routing wirings or dedicated pads as required for TEGs. Consequently, the degree of influence on the chip area is extremely low even if the monitor areas 1 are provided in four places on the semiconductor substrate 11.

Figure 7:
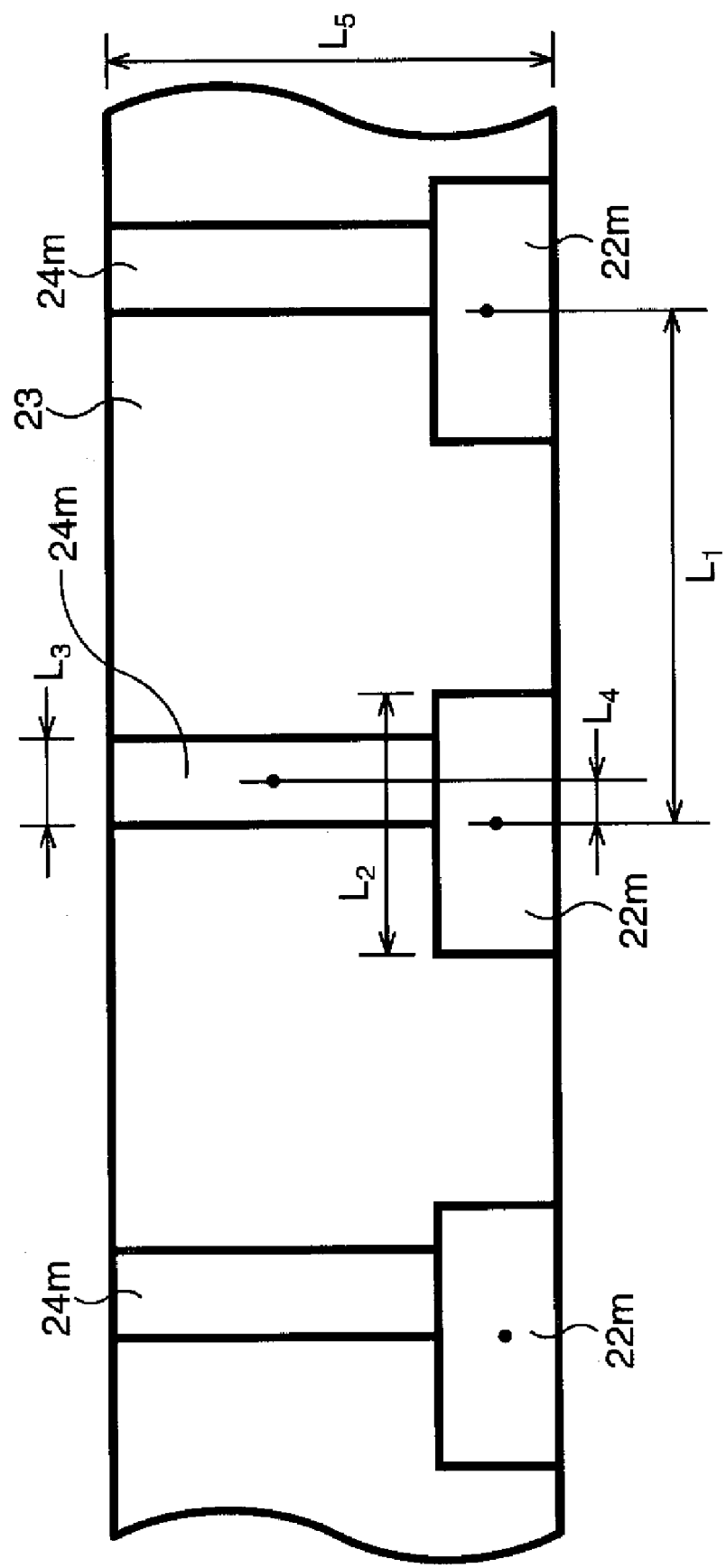
FIG. 7 is a schematic view illustrating a method for analyzing a cross section of a monitor area 1.

Next, an explanation will be made of a method for analyzing the cross section of the monitor area 1. FIG. 7 is a schematic view illustrating a method for analyzing the cross section of the monitor area 1. Although only the analysis regarding the wirings 22m, the interlayer insulating film 23 and the contact plugs 24m is explained here, it is possible to conduct similar analysis regarding other layers and so on.

First, after obtaining cross-sectional images using a cross-section SEM or TEM, the distance $L_1$ between the gravity centers of adjacent wirings 22m is determined on a monitor (or image data) of the electron microscope. It should be noted that the unit of the distance $L_1$ is defined as, for example, the number of pixels or a distance (nm) on the monitor. At this point, wirings, among the five wiring lines 22m, which are positioned at both ends are excluded from consideration. This is because the dimensions of the wirings positioned at both ends tend to differ from those of the three wirings 22m positioned therebetween, due to variation of the amount of exposure and defocus during an exposure process, due to a microloading effect during patterning and due to other effects. It should be noted that when the number of pixels is adopted on the monitor as the unit of the distance $L_1$, it is only necessary to determine the coordinates of the gravity centers and evaluate a difference therebetween.

When the width $x_1$ (nm) of the wirings 22m is determined, the width $L_2$ of, for example, the centrally positioned wiring 22m on the monitor is first determined. The unit of the width $L_2$ is made to correspond to that of the distance $L_1$. Since the spacing in terms of design between wirings 22m is 250 nm, the width $x_1$ of the wirings 22m can be determined from the following equation.

$$L_1:250 \text{ (nm)}=L_2:x_1 \text{ (nm)}$$

When the width $x_2$ (nm) of the contact plugs 24m is determined, the width $L_3$ of, for example, the centrally positioned contact plug 24m on the monitor is first determined. The unit of the width $L_3$ is made to correspond to that of the distance $L_1$. Then, the width $x_2$ of the contact plug 24m is determined from the following equation.

$$L_1:250 \text{ (nm)}=L_3:x_2 \text{ (nm)}$$

When the amount of positional shift $x_3$ (nm) between the wiring 22m and the contact plug 24m is determined, the distance $L_4$ between the gravity centers of the centrally positioned wiring 22m and contact plug 24m on the monitor is first determined. The unit of the distance $L_4$ is made to correspond to that of the distance $L_1$. Then, the amount of positional shift $x_3$ can be determined from the following equation.

$$L_1:250 \text{ (nm)}=L_4:x_3 \text{ (nm)}$$

When the thickness $x_4$ (nm) of the interlayer insulating film 23 is determined, the thickness $L_5$ of the interlayer insulating film 23m on the monitor is first determined. The unit of the thickness $x_4$ is made to correspond to that of the distance $L_1$. Then, the thickness $x_4$ of the interlayer insulating film 23m can be determined from the following equation.

$$L_1:250 \text{ (nm)}=L_5:x_4 \text{ (nm)}$$

In this manner, it is possible to obtain information about the wirings 22m, interlayer insulating film 23m and contact plugs 24m. Then, by comparing design values with the above-mentioned values, it is possible to easily know how much error has occurred in which process. For other layers and so on, it is possible to conduct similar analysis using the same photograph of cross sections.

As described heretofore, according to this embodiment, wiring defects, contact failures, positional shifts, the thickness of the interlayer insulating film, the thickness of the wiring, and the like can be easily detected by analyzing the monitor area 1 since the history in which the respective layers of the circuit area 2 were formed is reflected in the monitor area 1. Furthermore, the monitor area 1 can also be formed in a semiconductor device especially requiring microminiaturization since the area occupied by the monitor area 1 is extremely small.

It should be noted that wirings and the like of the semiconductor integrated circuit formed in the circuit area 2 tend to extend in either of the two mutually-perpendicular directions. It is therefore desirable that if at least two monitor areas 1 are provided, wirings and the like extend in the same direction within each monitor area 1, while, between at least two monitor areas 1, these wirings and the like extend in different directions, preferably in mutually-perpendicular directions, for example. By employing the above-described structure, it is possible to analyze two mutually-perpendicular cross sections.

Figure 8A:
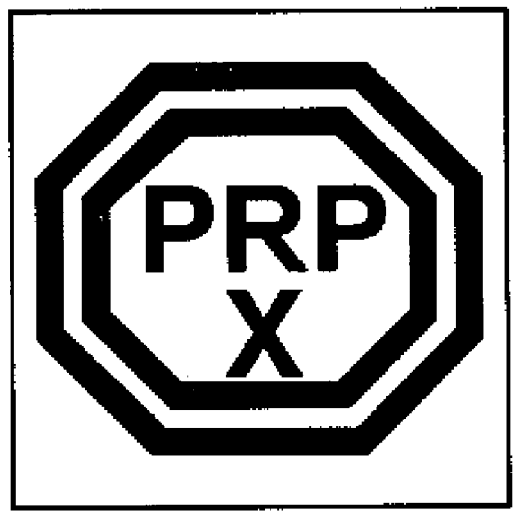
FIG. 8A is a schematic view illustrating an example of an identification marker.
Figure 8B:
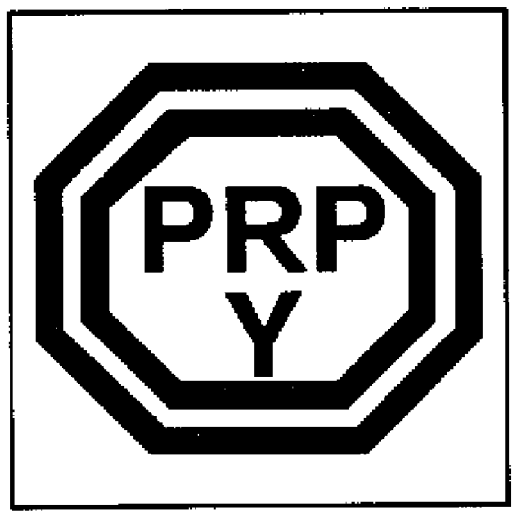
FIG. 8B is a schematic view illustrating another example of an identification marker.

It is also preferable to form an identification marker indicating the position of the monitor area 1 in the polyimide film 28, which is the outermost layer. Examples of the identification marker are shown in FIGS. 8A and 8B. The identification markers shown in FIGS. 8A and 8B are given to the same semiconductor device. In addition, the direction in which wirings and the like extend within the monitor area 1 labeled with the identification marker "PRP X" shown in FIG. 8A and the direction in which wirings and the like extend within the monitor area 1 labeled with the identification marker "PRP Y" shown in FIG. 8B are perpendicular to each other. In this manner, by varying the type of identification marker depending on the direction in which wirings and the like extend, it is possible to easily know the direction in which wirings and the like extend. It should be noted that "PRP" stands for "Production Record Pattern". However, the type and shape of identification markers are not limited to those shown in FIGS. 8A and 8B.

Furthermore, the number of monitor areas 1 is not limited to 4, nor are the positions thereof limited to four corners. For example, one of the monitor areas 1 may be provided in the center of the circuit area 2. Alternatively, the monitor area 1 may be provided in only one of the four corners of a chip, though this is not a preferred mode. Although it is preferable that layers corresponding to all the layers of the circuit area 2 be formed in the monitor area 1, it is still acceptable that some of the layers are missing.

Figure 9:
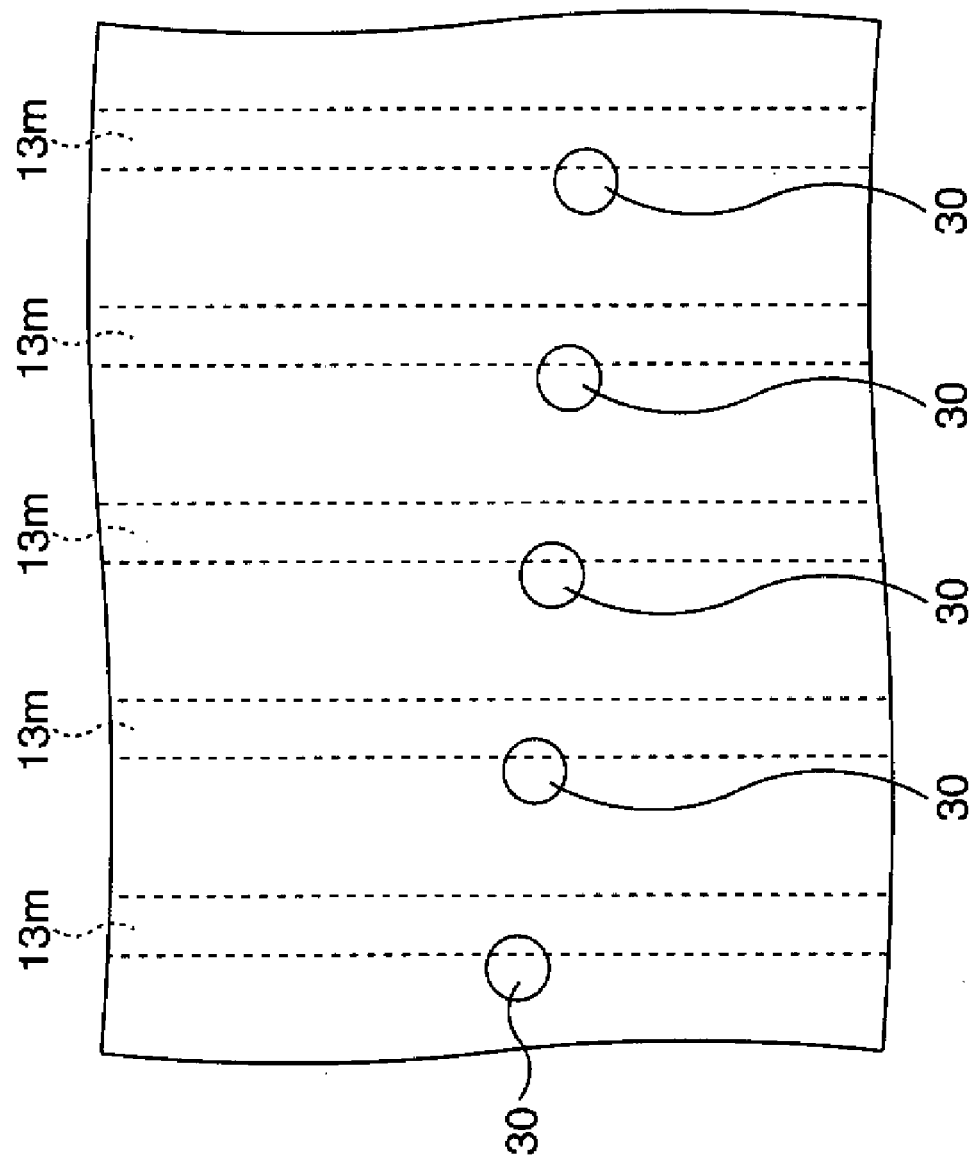
FIG. 9 is a schematic view illustrating an example of a contact plug.
Figure 10A:
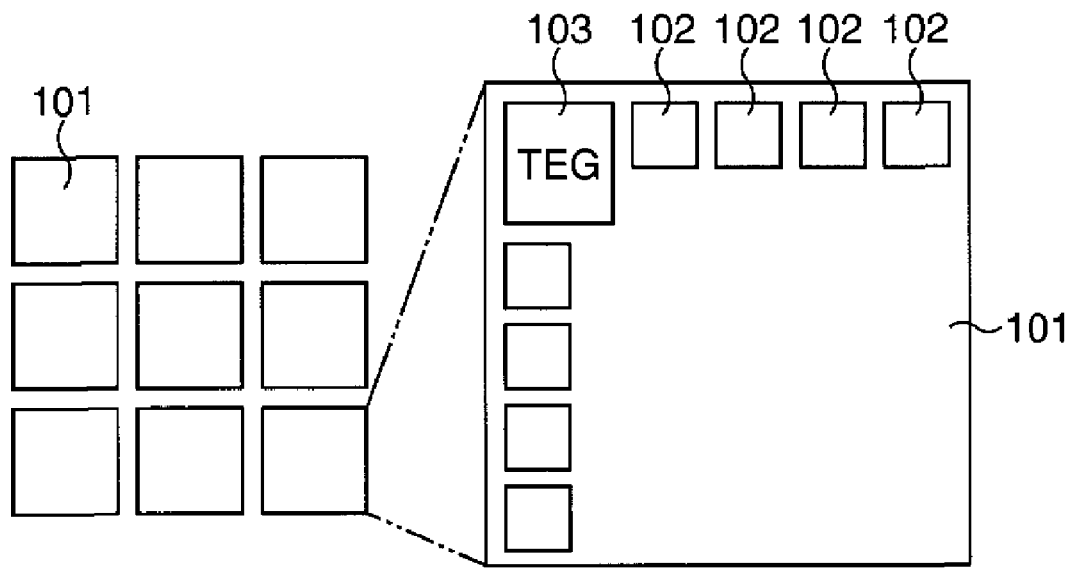
FIG. 10A is a schematic view illustrating a layout of a TEG when a single chip is transferred in one shot.
Figure 10B:
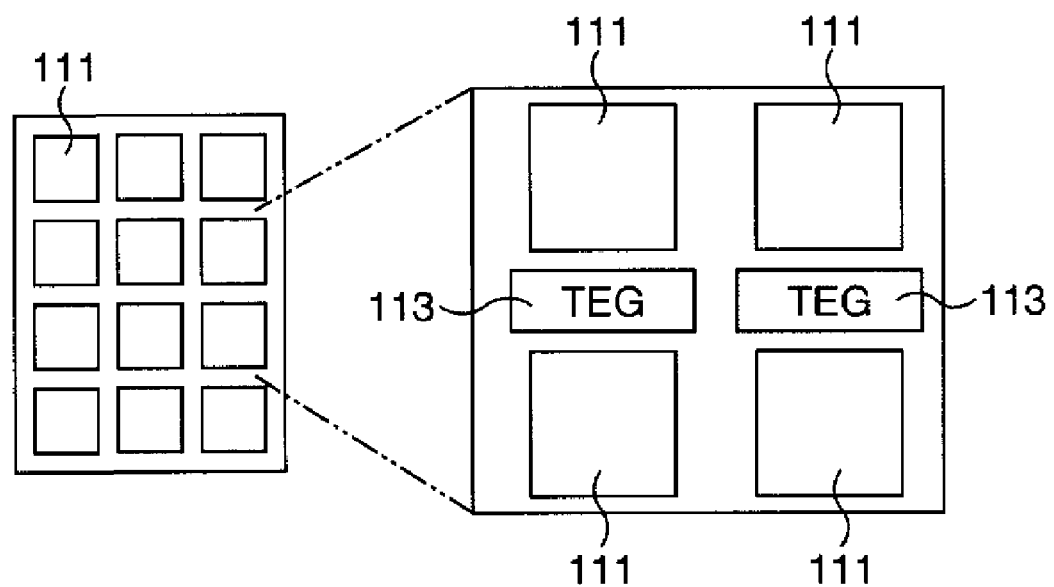
FIG. 10B is a schematic view illustrating a layout of TEGs when a plurality of chips are transferred in one shot.

In the above-described embodiment, the contact plugs are made to extend in the same direction as the isolation insulating films 12m. Alternatively, the planar shape of these contact plugs may be made circular as with the contact plugs formed in the circuit area 2. In this case, it is preferable that, as shown in FIG. 9, the positions of five contact plugs 30 be successively shifted along the direction in which the isolation insulating films 12m (not shown in FIG. 9) and gate electrodes 13m extend. If the positions of the contact plugs 30 are not shifted at all, the diameters thereof can be determined only in a cross section that intersects the centers of all of the contact plugs 30. In cross sections that do not intersect the center of any of the contact plugs 30, the diameters thereof cannot be determined. On the other hand, if the contact plugs 30 are positionally shifted as shown in FIG. 9, the diameters of the contact plugs can be determined in as many as five cross sections, thus widening the margin of analysis.

Figure 11A:
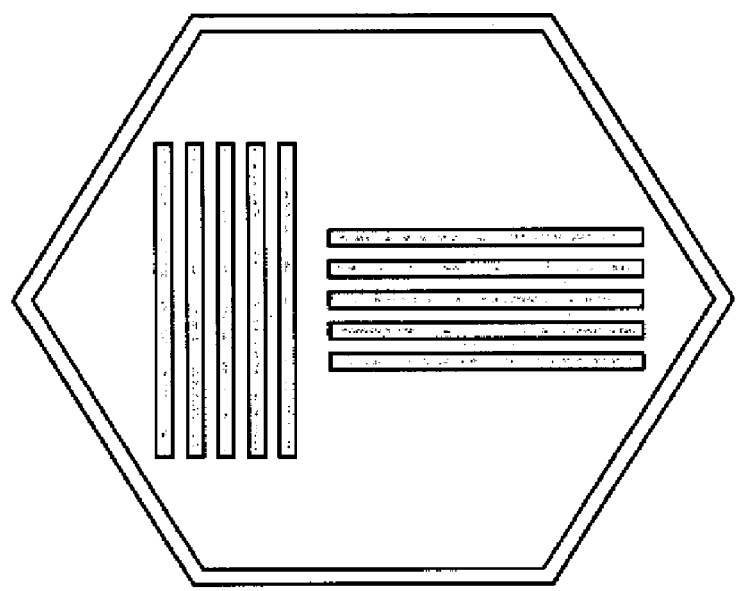
FIG. 11A is a schematic view illustrating yet another example of an identification marker.
Figure 11B:
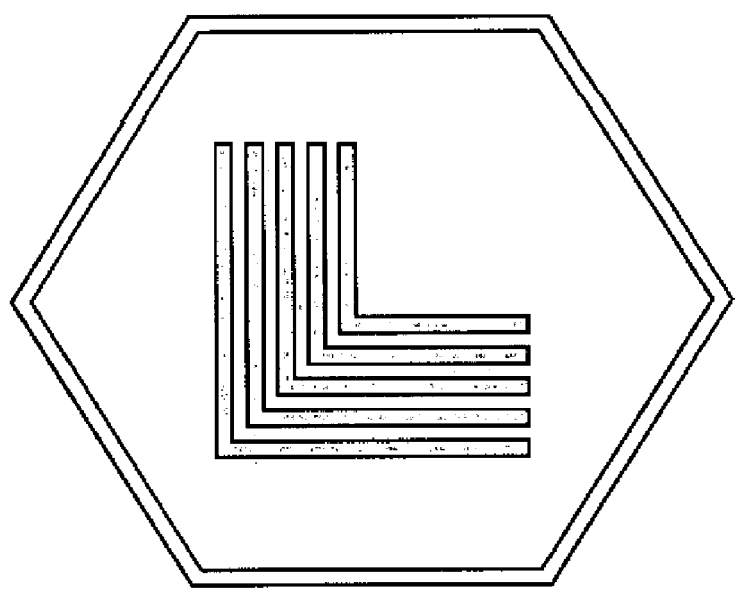
FIG. 11B is a schematic view illustrating yet another example of an identification marker.

Still alternatively, mutually-perpendicular linear patterns may be provided within one monitor area. For example, such a marker as shown in FIG. 11A or FIG. 11B may be used as identification marker and monitor layers having liner patterns identical to the above-described identification markers may be provided thereunder. By employing the above-described structure, it is possible to obtain information in mutually-perpendicular directions even if there is only one monitor area available.

Although Patent Document 1 states that extremely small pads for TEGs are provided in the four corners of each chip, routing wirings and the like are still required as long as the components thus provided are TEGs. For this reason, it is detrimental to high integration to provide TEGs in four corners. Another problem is that it is not possible to detect positional shifts between layers, defocus within a layer, and the like.

Patent Document 2 states that dummy elements are provided in order to detect positional shifts between through holes and wirings. However, even if these dummy elements are analyzed, it is not possible to detect positional shifts between layers, defocus within a layer, and the like.

Patent Document 3 states that the routing wirings of TEGs are shared among a plurality of chips to reduce the test time. However, it is not possible to detect positional shifts between layers, defocus within a layer, and the like.

Patent Document 4 states that wirings are also formed in the outer circumference of pads in order to detect short-circuits between wirings. This is detrimental to high integration, however, since TEGs are used. Another problem is that it is not possible to detect positional shifts between layers, defocus within a layer, and the like.

INDUSTRIAL APPLICABILITY

As described heretofore in detail, according to the present invention, even if a failure takes place, the cause thereof can be easily investigated by analyzing the cross section of a monitor pattern since the history of formation of layers in a circuit area is reflected in the monitor pattern. Furthermore, since electrical signals need not be applied to a monitor area, there is no need for pads, routing wirings and the like. Consequently, an increase in the chip area caused by the monitor areas is extremely insignificant.

What is claimed is:
1. A semiconductor device comprising:
a circuit area in which a semiconductor integrated circuit is formed; and
a monitor area having at least two monitor layers simultaneously formed with at least two layers each composing said semiconductor integrated circuit, the at least two monitor layers including a first monitor layer and a second monitor layer, the first monitor layer and the second monitor layer being stacked,
wherein the first monitor layer includes at least five first monitor patterns of substantially the same shape and are disposed at a first pitch between each other,
wherein the second monitor layer includes at least five second monitor patterns of substantially the same shape and are disposed at a second pitch between each other,
wherein all of the first monitor patterns and the second monitor patterns extend in a first direction,
wherein the first monitor patterns and the second monitor patterns are respectively coupled via grooves which extend in the first direction and are embedded with conductive film,
wherein the semiconductor integrated circuit, the five first monitor patterns, and the five second monitor patterns are provided in a chip which has been chipped by dicing a semiconductor wafer,
wherein the grooves comprises a linear first side extending in the first direction and a linear second side extending parallel to the first side in the first direction,
wherein the five first monitor patterns and the five second monitor patterns are not electrically connected to a pad,
wherein the monitor area includes a first monitor area and a second monitor area, and the directions in which monitor patterns extend differs between the first monitor area and the second monitor area, and
wherein the directions in which said monitor patterns extend in the first monitor area and the second monitor area are perpendicular to each other, and both of the directions are parallel to a surface of a substrate above which the first monitor patterns and the second monitor patterns are formed.

2. The semiconductor device according to claim 1, further comprising an identification marker indicating a position of said monitor area.

3. The semiconductor device according to claim 1, wherein the monitor area includes a first monitor area and a second monitor area, and said semiconductor device further comprises at least two identification markers indicating positions of the first monitor area and the second monitor area.

4. The semiconductor device according to claim 3, wherein all of the first monitor patterns and the second monitor patterns provided in each of the first monitor area and the second monitor area extend in the same direction, the directions in which the first monitor patterns and second monitor patterns extend differ between the first monitor area and the second monitor area, and said identification markers indicate positions of the first monitor area and the second monitor area and the directions in which said monitor patterns extend.

5. The semiconductor device according to claim 1, wherein said monitor layers are formed in correspondence with all of layers composing said semiconductor integrated circuit.

6. The semiconductor device according to claim 1, wherein said monitor areas are formed in four corners.

7. The semiconductor device according to claim 6, wherein said monitor areas are also formed in a center of said circuit area.

8. The semiconductor device according to claim 1, wherein the first monitor patterns do not overlap the second monitor patterns in a vertical direction.

9. The semiconductor device according to claim 1, wherein the first monitor patterns overlap at least portions of the second monitor patterns in a vertical direction.

10. The semiconductor device according to claim 1, further comprising:
a third monitor layer above the second monitor layer,
wherein the third monitor layer includes at least five third monitor patterns of substantially the same shape and are disposed at a third pitch between each other.

11. The semiconductor device according to claim 1, wherein the first monitor patterns includes isolation insulating films and the second monitor patterns includes gate electrodes.

* * * * *